(12) United States Patent
Wu et al.

(10) Patent No.: US 6,565,984 B1
(45) Date of Patent: May 20, 2003

(54) CLEAN ALUMINUM ALLOY FOR SEMICONDUCTOR PROCESSING EQUIPMENT

(75) Inventors: Shun Wu, Cupertino, CA (US); Clifford Stow, Santa Clara, CA (US); Hong Wang, Cupertino, CA (US); Yixing Lin, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/161,192

(22) Filed: May 28, 2002

(65) Prior Publication Data (65)

(51) Int. Cl.[7] .......................... B32B 15/04; C25D 11/04
(52) U.S. Cl. .................. 428/472.2; 205/324; 205/325; 428/629; 428/632; 428/310.5; 428/318.4; 428/323; 428/328; 428/330; 428/332; 428/334; 428/697; 428/702
(58) Field of Search .................. 428/472.2, 629, 428/632, 310.5, 318.4, 323, 328, 330, 332, 334, 697, 702; 205/324, 325

(56) References Cited

U.S. PATENT DOCUMENTS

| 5,039,388 | A | | 8/1991 | Miyashita et al. ...... 204/192.32 |
| 5,756,222 | A | | 5/1998 | Bercaw et al. .............. 428/649 |
| 5,811,195 | A | | 9/1998 | Bercaw et al. .............. 428/472 |
| 6,242,111 | B1 | * | 6/2001 | Telford et al. .............. 428/629 |
| 2001/0019777 | A1 | * | 9/2001 | Tanaka et al. ............ 428/472.2 |

OTHER PUBLICATIONS

ASM Committee on Aluminum and Aluminum Alloys, "Heat Treatment of Aluminum Alloys", Metals Handbook, pp. 28–43, 9th Ed., vol. 2, (American Society for Metals: Metals park, OH), no date.

* cited by examiner

Primary Examiner—Robert R. Koehler
(74) Attorney, Agent, or Firm—Shirley L. Church

(57) ABSTRACT

We have discovered that the formation of particulate inclusions at the surface and the interior of an aluminum alloy article interferes with the performance of the article when a surface of the article is protected by an anodized coating. We have also discovered that the formation of such particulate inclusions can be controlled to a large extent by controlling the concentration of particular impurities present in the alloy used to fabricate the aluminum alloy article.

24 Claims, 3 Drawing Sheets

CLEAN ALUMINUM ALLOY FOR SEMICONDUCTOR PROCESSING EQUIPMENT

FIELD OF THE INVENTION

In general, the present invention relates to a composition of an aluminum alloy used in the fabrication of semiconductor processing apparatus. In particular, the invention relates to a structure comprising a clean aluminum alloy which is particularly advantageous when used to fabricate semiconductor processing chamber components.

BRIEF DESCRIPTION OF THE BACKGROUND ART

Semiconductor processing involves a number of different chemical and physical processes whereby minute integrated circuits are created on a substrate. Layers of materials which make up the integrated circuit are created by chemical vapor deposition, physical vapor deposition, and epitaxial growth, for example. Some of the layers of material are patterned using photoresist masks and wet and dry etching techniques. Patterns are created within layers by the implantation of dopants at a particular locations. The substrate upon which the integrated circuit is created may be silicon, gallium arsenide, glass, or any other appropriate material.

Many of the semiconductor processes used to produce integrated circuits employ halogen or halogen-containing gases or plasmas. Some processes use halogen-containing liquids. In addition, since the processes used to create the integrated circuits leave contaminant deposits on the surfaces of the processing apparatus, such deposits are commonly removed using plasma cleaning techniques which employ at least one halogen-containing gas. The cleaning procedure may include a wet wipe with deionized water, followed by a wipe with ispropyl alcohol.

Aluminum has been widely used as a construction material for semiconductor fabrication equipment, at times because of its conductive properties, and generally because of its ease in fabrication and its availability at a reasonable price. However, aluminum is susceptible to reaction with halogens such as chlorine, fluorine, and bromine to produce for example, $AlCl_3$ (or $Al_2Cl_6$); or $AlF_3$; or $AlBr_3$ (or $Al_2Br_6$). The aluminum-fluorine compounds can flake off the surfaces of process apparatus parts, causing an eroding away of the parts themselves, and serving as a source of particulate contamination of the process chamber (and parts produced in the chamber). Most of the compounds containing aluminum and chlorine, and many of the compounds containing aluminum and bromine, are gaseous under semiconductor processing conditions and leave the aluminum structure, creating voids which render the structure unstable and produce a surface having questionable integrity.

A preferred means of protecting the aluminum surfaces within process apparatus has been an anodized coating. Anodizing is typically an electrolytic oxidation process that produces an integral coating of aluminum oxide on the aluminum surface. Despite the use of anodized protective layers, the lifetime of anodized aluminum parts in semiconductor processing apparatus, such as susceptors in CVD reactor chambers and gas distribution plates for etch process chambers, has been limited due to the gradual degradation of the protective anodized film. Failure of the protective anodized film leads to excessive particulate generation within the reactor chamber, requiring maintenance downtime for replacing the failed aluminum parts and for cleaning particulates from the rest of the chamber.

Miyashita et al., in U.S. Pat. No. 5,039,388, issued Aug. 13, 1991, describe a plasma forming electrode used in pairs in a semiconductor processing chamber. The electrode is formed from a high purity aluminum or an aluminum alloy having a chromic acid anodic film on the electrode surface. The chromic acid anodized surface is said to greatly improve durability when used in a plasma treatment process in the presence of fluorine-containing gas. The electrode is described as formed from a high purity aluminum such as JIS 1050, 1100, 3003, 5052, 5053, and 6061, or similar alloys such as Ag—Mg alloys containing 2 to 6% by weight magnesium.

U.S. Pat. No. 5,756,222, to Bercaw et al., issued May 26, 1998, and entitled "Corrosion-Resistant Aluminum Article For Semiconductor Processing Equipment", describes an article of manufacture useful in semiconductor processing which includes a body formed from a high purity aluminum-magnesium alloy having a magnesium content of about 0.1% to about 1.5% by weight, either throughout the entire article or at least in the surface region which is to be rendered corrosion-resistant, and an impurity atom content of less than 0.2% by weight. Impurity atoms particularly named include silicon, iron, copper, chromium, and zinc. The high purity aluminum-magnesium alloy may be overlaid by a cohesive film which is permeable to fluorine, but substantially impermeable to oxygen. Examples of such a film include aluminum oxide or aluminum nitride. The subject matter disclosed in this patent is hereby incorporated by reference in its entirety.

U.S. Pat. No. 5,811,195, to Bercaw et al., issued Sep. 22, 1998, and entitled "Corrosion-Resistant Aluminum Article For Semiconductor Equipment", further discloses that the magnesium content of the aluminum article may be in the range of about 0.1% to about 6.0% by weight of the aluminum article. However, for operational temperatures of the article which are greater than about 250° C., the magnesium content of the aluminum article should range between about 0.1% by weight and about 1.5% by weight of the article. In addition, an article is described in which the impurities other than magnesium may be as high as about 2.0% by weight in particular instances. One example is when there is a film overlying the exterior region of the article body, where the film comprises aluminum oxide or aluminum. Another example is where there is a magnesium halide layer having a thickness of at least about 0.0025 $\mu m$ over the exterior surface of the aluminum article. The subject matter disclosed in this patent is hereby incorporated by reference in its entirety.

For an aluminum alloy to be useful in the fabrication of semiconductor processing apparatus, it must not only exhibit low level of impurity atoms, but it must also have desirable mechanical properties. The mechanical properties must enable machining to provide an article having the desired dimensions. For example, if the alloy is too soft, it is difficult to drill a hole, as material tends to stick during the drilling rather than to be removed by the drill. Controlling the dimensions of the machined article is more difficult. There is penalty in machining cost. The mechanical properties of the article also affect the ability of the article to perform under vacuum. For example, a process chamber must exhibit sufficient structural rigidity and resistance to deformation that it can be properly sealed against high vacuum. Finally, when the article is treated, to reduce stress, for example, the treatment must ensure that there is uniform transfer of loads and stresses.

The "Metals Handbook", Ninth Edition, Volume 2, copyright 1979, by the American Society for Metals, describes the heat treatment of aluminum alloys, beginning at page 28. In particular, for both heat-treatable and non-heat-treatable aluminum alloys, annealing to remove the stress created during cold work is accomplished by heating within a temperature range from about 300° C. (for batch treatment) to about 450° C. (for continuous treatment).

In general, the term "heat treatment" applied to aluminum alloys is said to be restricted to the specific operations employed to increase strength and hardness of precipitation-hardenable wrought and cast alloys. These are referred to as "heat-treatable" alloys, to distinguish them from alloys in which no significant strengthening can be achieved by heating and cooling. The latter are generally said to be referred to as "non-heat-treatable" alloys, which, in wrought form, depend primarily on cold work to increase strength. At page 29 of the "Metals Handbook", Table 1 provides typical full annealing treatments for some common wrought aluminum alloys. The 5xxx series of aluminum alloys are of interest for use in fabricating semiconductor processing apparatus because some of the alloys offer impurity concentrations within acceptably moderate ranges, while providing sufficient magnesium content to perform in the manner described in the Bercaw et al. patents. These alloys are not considered to be heat treatable.

Standard thermal stress relief of non-heat-treatable aluminum alloys such as the 5xxx series assumes peak temperatures approaching 345° C. and generic ramp rates and dwell times, without regard to the alloy or the final use of individual articles fabricated from the alloy. Aluminum alloys begin to exhibit grain growth at temperatures approaching 345° C., and enhanced precipitation of non-aluminum metals at the grain boundaries, which may lead to cracking along the grain boundaries during machining. The above factors also have an impact on the mechanical properties of the alloy by affecting the uniformity of the alloy composition within the article. When attempting to achieve the mechanical properties required for the aluminum alloy body of the article, it is necessary to ensure that the treatment of the alloy to improve mechanical properties will not cause other problems in the finished article.

When the article fabricated from an aluminum alloy is to be used in a corrosive atmosphere, it is frequently necessary to provide protective coatings such as an anodized layer over the aluminum surface. This is particularly true for applications of aluminum in semiconductor processing where corrosive chlorine or fluorine-containing etchant gases and plasmas generated from these gases are employed. A stable anodized layer over the surface of the specialty aluminum alloy helps maintain a halide protective component at or near the surface of the aluminum alloy. The anodized layer also helps prevent abrasion of the aluminum surface as well as any other protective layer present on the aluminum surface. The combination of the anodized layer and a halide protective component overlying the specialty aluminum alloy provides an article capable of long-term functionality in the corrosive environment. Not only is there significant expense in equipment maintenance and apparatus replacement costs due to degradation of the protective anodized film, but if a susceptor, for example, develops significant surface defects, these defects can translate through to affect a silicon wafer atop the susceptor, creating contamination on the wafer which leads to device current leakage or even short. This can affect the reliability of the device. Unreliable products can cause significant damage to a manufacturer's reputation.

Aluminum alloy 6061 is a standard aluminum alloy typically used to fabricate semiconductor processing equipment. The 6061 alloy generally has the following impurity content by weight %: a magnesium concentration ranging from about 0.8% to about 1.2%, a silicon concentration ranging from 0.4% to about 0.8%, an iron concentration up to 0.7%, a copper concentration ranging from about 0.15% to about 0.4%, a manganese concentration of about 0.15%, a zinc concentration of about 0.25%, a chromium concentration ranging from about 0.04% to about 0.35%, with other single impurities not exceeding about 0.05% each, and other total impurities not exceeding about 0.15%.

Some of these elements can be harmful to a semiconductor device fabricated in a process chamber including the 6061 alloy. For example, a copper layer used as a metal interconnect in semiconductor circuits is desirable due to its low resistivity. However, the presence of copper impurities in semiconductor process chamber components is undesirable, because copper contamination from process chamber components onto a substrate processed in the chamber will affect the performance of integrated circuit devices which are present on the substrate.

There are some specialty aluminum alloys which have been developed for use in semiconductor processing equipment, but such alloys are particularly expensive to manufacture.

It would be desirable to have an aluminum alloy which is cost-effective to manufacture, has the desired mechanical and chemical properties, and which works well in combination with an anodized coating to provide a long performance lifetime for the processing apparatus.

SUMMARY OF THE INVENTION

We have discovered that the formation of particulate inclusions at the surface and the interior of an aluminum alloy article interferes with the performance of the article when a surface of the article is protected by an anodized coating. We have also discovered that the formation of such particulate inclusions can be controlled to a large extent by controlling the concentration of particular impurities present in the alloy itself.

In particular, we have determined that an aluminum alloy having the following impurities present by weight %, while being relatively inexpensive to fabricate, will perform well when used in the fabrication of semiconductor processing apparatus: A silicon at a concentration ranging between about 0.54% and about 0.74%, copper at a concentration ranging between about 0.15% and about 0.30%, iron at a concentration ranging between about 0.05% and about 0.20%, manganese at a concentration up to about 0.14%, zinc is at a concentration up to about 0.15%, chromium at a concentration ranging about 0.16% and about 0.28%, titanium at a concentration up to about 0.06%, and magnesium at a concentration ranging between about 0.9% and about 1.1%. The total of other impurities present in the aluminum alloy are not to exceed 0.15%, with individual other impurities limited to a maximum of 0.05% each.

In addition to the chemical compositional requirements, the aluminum alloy is required to meet particular specifications with respect to particulates formed from the impurities present in the alloy. Of the particulate agglomerations of impurity compounds, at least 85% of all particles must be less than 5 $\mu$m in size. Less than 15% of the particles may range from 5 $\mu$m to 20 $\mu$m in size. No more than 1% of the particles may be larger than 20 $\mu$m in size, with no particles larger than 40 $\mu$m.

An aluminum article after extrusion into a desired shape, or an aluminum article after machining into a desired shape from a block or billet, is typically stress relieved at a temperature about 415° C. or less. The stress relief provides a more stable surface for application of the anodized protective film and may provide improved mechanical performance properties.

BRIEF DESCRIPTION OF THE DRAWINGS

A better understanding of the invention is obtained when the following detailed description is considered in conjunction with the following drawings in which.

DETAILED DESCRIPTION OF THE INVENTION

As a preface to the detailed description, it should be noted that, as used in this specification and the appended claims, the singular forms "a", "an", and "the" include plural referents, unless the context clearly dictates otherwise.

Figure 1:
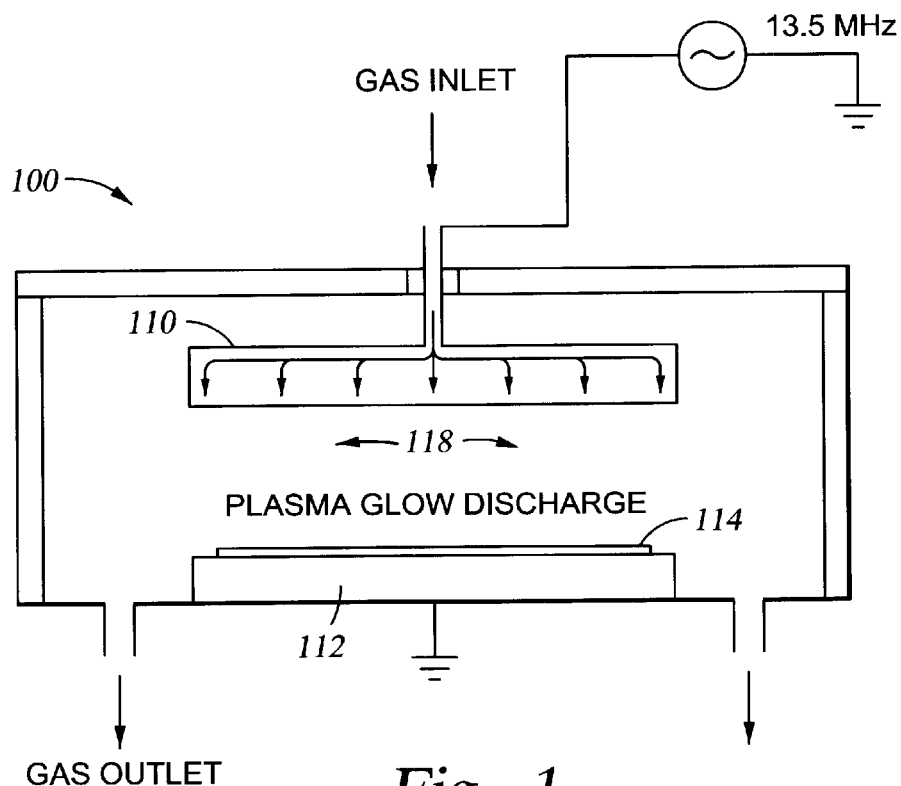
FIG. 1 shows a schematic of a conventional reactor chamber 100 used for semiconductor substrate fabrication processes.

The present invention is to provides a semiconductor processing apparatus which is resistant to corrosive processing conditions. FIG. 1 shows a schematic of a conventional reactor chamber 100 used for semiconductor substrate fabrication processes, such as chemical vapor deposition (CVD) or etching. Such processes typically subject the components within the chamber to corrosive halogen-containing species 118. Particularly corrosive are the gas mixtures typically used to plasma clean the chamber components, such as gas mixtures of carbon tetrafluoride with nitrous oxide ($CF_4/N_2O$) and tetrafluoroethylene with oxygen ($C_2F_4/O_2$), for example and not by way of limitation. During semiconductor processing chamber components are subjected to high temperatures ranging from 100° C. to about 450° C. and to corrosive halogen-containing gas mixtures during periodic chamber cleaning.

Referring to FIG. 1, certain chamber components, such as perforated plate 110 (which functions both to deliver process gases into the chamber and as an RF electrode for exciting a plasma) and susceptor 112 (which supports the semiconductor substrate 114 and also functions as an RF electrode) are conventionally constructed of aluminum with a surface protected by an anodized coating.

The most commonly used aluminum alloy in semiconductor processing equipment is 6061. To enable the aluminum alloy to resist corrosion, an anodized protective layer is applied over a surface of the aluminum alloy which is to be exposed to the corrosive processing environment. To obtain the best corrosion resistance and longest acceptable performance lifetime for the apparatus, the article is fabricated in a particular manner. For best results, the aluminum alloy used for the body of the article should be formed from a specialized clean aluminum alloy.

Figure 2:
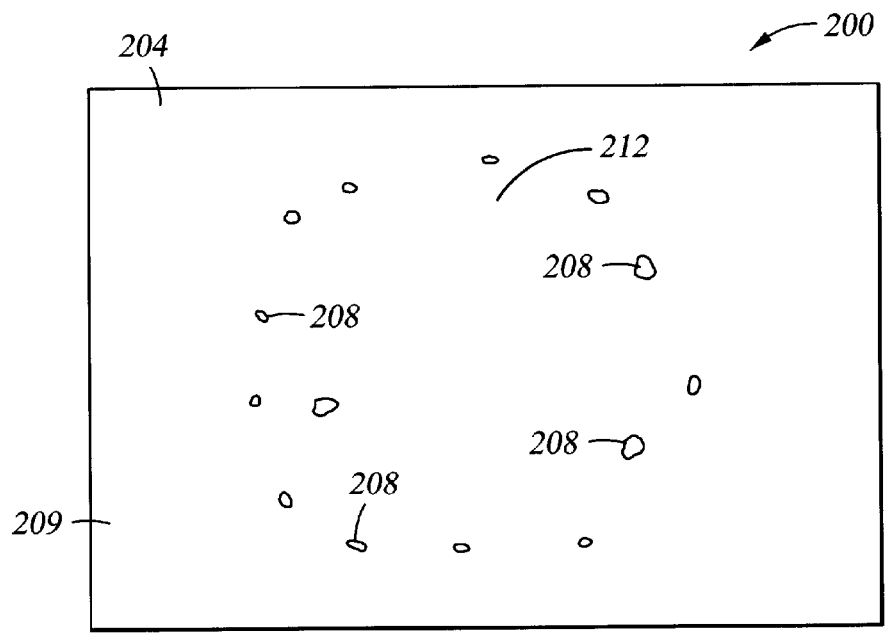
FIG. 2 is a schematic top view of a structure 200 which comprises an aluminum alloy (not shown) under an anodized coating layer 204 having defects 208.

FIG. 2 shows a schematic top view of a semiconductor processing apparatus component 200 which was fabricated from a 6061 aluminum alloy (not shown) protected by an anodized coating 204. However defects 208 appeared on the surface 209 of anodized coating 204 after exposure of apparatus component 200 to a plasma etch environment. The defects 208 became sufficiently severe with time that contaminant particulates began to flake off in area 212 due to the presence of defects 208.

Figure 3A:
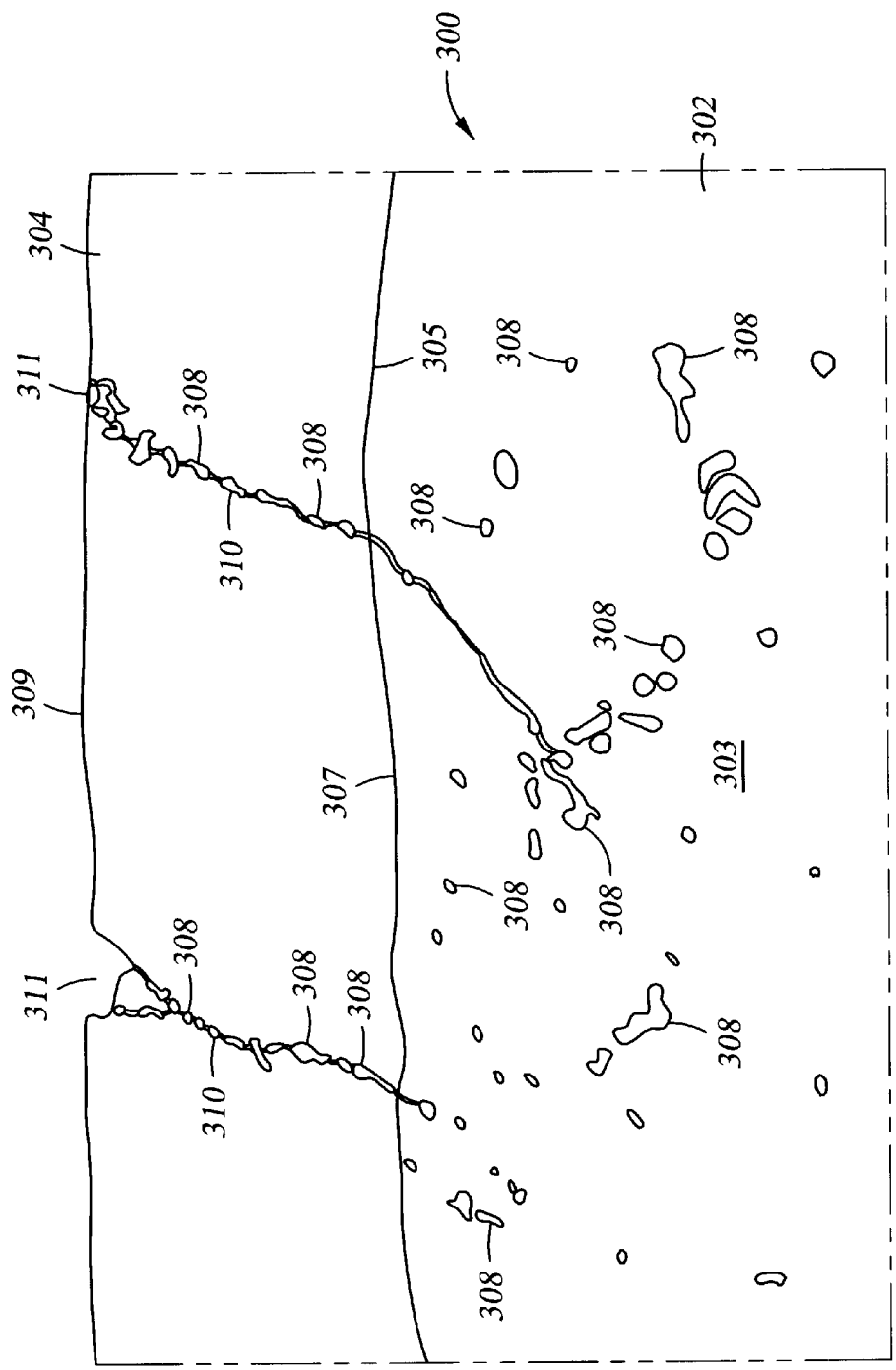
FIG. 3A is a schematic of a photomicrograph which shows a cross-sectional view of an aluminum alloy 302 and anodized coating layer 304, structures which led to the defects 208 shown on the upper surface 209 of anodized coating 204 in FIG. 2A.

FIG. 3A shows a schematic of a cross-sectional view of a section 300 of a semiconductor processing chamber wall (not shown) where the chamber wall included a 6061 aluminum alloy 302 having a protective anodized layer 304 over the upper surface 305 of aluminum alloy 302, which forms an interface 307 between aluminum alloy 302 and anodized layer 304. Typically, this anodized layer 304 ranges in thickness from about 0.3 mil (8 $\mu$m) to about 4.0 mil (100 $\mu$m). We discovered that the cause of defects 311 on the upper surface 309 of the section 300 of the processing chamber wall was the formation of agglomerations 308 of impurities and impurity compounds which were present in the 6061 aluminum alloy. The agglomerations 308 formed conduits or channels 310 which extended through parts of the body 303 of the 6061 alloy and into the anodized coating 304, to produce defects 311 on the upper surface 309 of anodized coating 304. As a result, corrosive plasma species, for example, were able to penetrate through channels 310, downward through anodized coating 304 and were able to attack aluminum present at the interface 307 between anodized coating 304 and body 303. The mechanism illustrated in FIG. 3A explains the defects 208 which were observed on the upper surfaces of anodized 6061 aluminum process chambers, as illustrated in FIG. 2.

Iron is a problem metal which may cause corrosion when present in an aluminum alloy used in semiconductor processing equipment. During manufacture of an aluminum alloy, large agglomerates of iron-containing compounds are frequently formed within the alloy. A large number of the agglomerations 308 shown in FIG. 3A include iron or iron-containing compounds, which are present at various locations within the aluminum alloy. The iron-containing agglomerates may appear in and on the surface of an alloy sheet, billet, or extruded part. For applications in industries other than the semiconductor industry, these agglomerates do not pose a problem. However, in the case of semiconductor processing equipment, the presence of iron-containing agglomerates in the starting material used to fabricate a processing vessel (or other apparatus internal to a processing chamber) can cause a major problem. Agglomerates 308 including the iron-containing compounds present at the interface 307 between body 303 and protective anodized coating 304 contribute to the formation of tunnels 310 through anodized coating 304 to the base aluminum in body 303. The tunnels 310 expose the base aluminum to various processing chemicals which can corrode aluminum alloy body 303. This is particularly true for applications of aluminum in semiconductor processing apparatus in which corrosive chlorine or fluorine-containing etchant gases and plasmas generated from these gases are employed. Eventually, if the corrosion is severe enough, entire areas of the apparatus surface can flake off into the semiconductor processing chamber and contaminate subsequent processing operations performed within the processing chamber. While the iron itself imparts no major beneficial quality to the alloy, the cost of removal of the iron from the alloy increases manufacturing cost of the alloy. As the iron content goes down, cost to manufacture the aluminum alloy goes up.

As described above, with respect to semiconductor processing apparatus, there are particular impurities, both in elemental and compound form which need to be controlled if the aluminum alloy is to be used for semiconductor processing applications. We have discovered that elements of particular concern in terms of the formation of agglomerations include silicon, iron and copper. There are other impurities which also need to be controlled within particular ranges.

In order to prevent the formation of the channels, and microtunnels 310 shown in FIG. 3A, and microcracks which can lead to the contamination and corrosion of an aluminum-comprising semiconductor processing apparatus component, we have developed a "clean" aluminum alloy. The clean alloy is designed to reduce the number and size of impurity compound agglomerates 308 shown in FIG. 3A, while maintaining the cost of the alloy as low as possible.

The composition of the clean aluminum alloy is carefully controlled so that impurities present within the alloy fall into specific concentration ranges. The impurities present within the alloy are limited to the following weight % ranges: silicon at a concentration ranging between about 0.54% and about 0.74% copper at a concentration ranging between about 0.15% and about 0.3% (more typically, between about 0.15% and about 0.25%); iron at a concentration ranging between about 0.05% and about 0.2% (more typically up to 0.1%); manganese at a concentration ranging up to about 0.14%, zinc is at a concentration up to about 0.15%, chromium at a concentration ranging between about 0.16% and about 0.28%, titanium at a concentration ranging up to 0.06%, and magnesium at a concentration ranging between about 0.9% and about 1.1%. The total of other impurities present in the aluminum alloy are not to exceed 0.15% with individual other impurities limited to less than about 0.05% each.

Independent of other impurities present, we discovered that the more harmful impurities are iron, silicon and copper. We further determined that the silicon content should be maintained at atomic concentrations of less than about 0.74% by weight, that iron should be maintained at atomic concentrations ranging from about 0.05% to about 0.2% by weight, and that copper should be maintained at atomic concentrations ranging from about 0.15% to about 0.3% by weight. Typically, an iron concentration of less than about 0.1% by weight and a copper concentration ranging from about 0.15% to about 0.25% by weight provides good results.

Further the impurity particulate size and distribution of the clean aluminum alloy are controlled to be within particular ranges. The impurity particulates are within a specific limit such that, at least 85% of all particles are less than 5 μm in size. Less than 15% of the particles may range from 5 μm to 20 μm in size. No more than 1% of the particles may be larger than 20 μm, with no particles being larger than 40 μm.

The analysis technique used to determine particle size and size distribution was based on back-scattered image analysis under the scanning electron microscope (SEM). The magnification was 500× in order to assess the constituent particles. The area of each image was about 150 μm×200 μm. The digital resolution was at least 0.2 μm/pixel. At least 40 images were taken at random from sample areas of 0.75 inch in diameter in order to obtain good assessment of various areas on the metal microstructure, to ensure meaningful statistical analysis. The back-scattered images were digitally stored for subsequent statistical analysis. The images were transferred to an image analyzer, and the distribution of particles with a mean atomic number higher than that of Al (white in the images) was detected and measured. The digital resolution allowed for measurement of particles as small as 0.2 μm. The parameters to determine the particle size distribution were: the diameter of the area equal circle (φ=2×square root of (A/π), where A is the area of a particle. The class limits were as follows: 0.2; 1; 2; 3; 4; 5; 20; 40. The number of particles. in each class was determined and then normalized to 100% for the total number of particles measured.

Figure 3B:
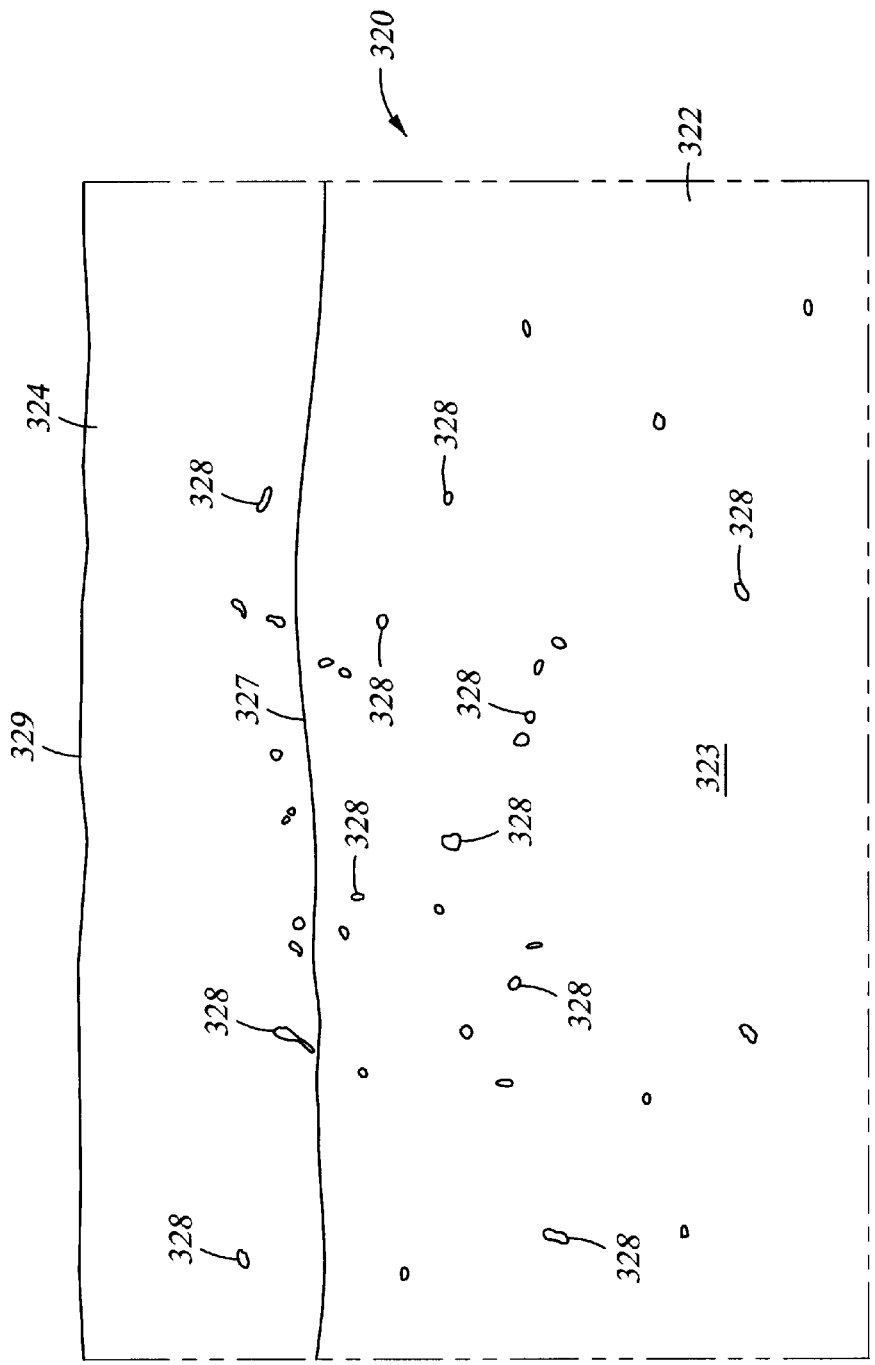
FIG. 3B is a schematic of a photomicrograph which shows a cross-sectional view of an aluminum alloy 322 of the present invention, where no defects are observed on the upper surface 329 of anodized coating layer 324.

FIG. 3B shows a schematic of a cross-sectional view of a section 320 of a semiconductor processing chamber wall (not shown) where the chamber wall included an alloy of the present invention 322 having an anodized protective coating 324 which forms an interface 327 with aluminum alloy body 323. Typically this anodized coating 324 ranges in thickness from about 0.3 mil (8 μm) to about 4.0 mil (100 μm). Agglomerates 328 of impurity compounds are still present in the body 323 of aluminum alloy 322, but the agglomerates 328 are much smaller in size on average and do not produce channels which extend up to the upper surface 329 of anodized coating 324. Thus, the lifetime of the semiconductor processing chamber is extended substantially.

The above described exemplary embodiments are not intended to limit the scope of the present invention, as one skilled in the art can, in view of the present disclosure, expand such embodiments to correspond with the subject matter of the invention claimed below.

We claim:

1. A clean aluminum alloy for use in the fabrication of semiconductor apparatus where at least a portion of the clean aluminum alloy surface is protected by an anodized coating, said clean aluminum alloy comprising impurity particulates such that at least 85% said impurity particulates are less than 5 μm in size, less than 15% of said impurity particulates range in size from 5 μm to 20 μm in size, and less than about 1% of said impurity particulates are larger than 20 μm in size, with no impurity particulates being larger than 40 μm.

2. A clean aluminum alloy in accordance with claim 1, wherein said impurity particulates are formed from impurities selected from the group consisting of magnesium, silicon, iron, copper, manganese, zinc, chromium, titanium, and compounds thereof.

3. A clean aluminum alloy in accordance with claim 2, wherein iron is present at atomic concentration of less than about 0.2 weight %, and copper is present at an atomic concentration of less than about 0.3 weight %.

4. A clean aluminum alloy in accordance with claim 3, wherein iron is present at an atomic concentration of less than about 0.1 weight % and copper is present at an atomic concentration of less than about 0.25 weight %.

5. A clean aluminum alloy in accordance with claim 4, wherein copper is present at an atomic concentration ranging from about 0.15 to about 0.25 weight %.

6. A clean aluminum alloy in accordance with claim 2, wherein said impurities include the following present at an atomic weight % as specified or lower, silicon at 0.74 weight %; iron at 0.2 weight %; copper at 0.3 weight %; and magnesium at 1.1 weight %.

7. A clean aluminum alloy in accordance with claim 6, wherein said impurities include the following present at an atomic weight % as specified or lower, silicon at 0.74 weight %; iron at 0.2 weight %; copper at 0.3 weight %; manganese at 0.14 weight %; zinc at 0.15 weight %; chromium at 0.28 weight %; titanium at 0.06 weight %, and magnesium at 1.1 weight %, and wherein a total of other impurities present in said aluminum alloy ranges is 0.15 weight % or less, with individual other impurities limited to a maximum of 0.05 weight % each.

8. A clean aluminum alloy in accordance with claim 6 or claim 7, wherein said silicon is present at a concentration ranging between about 0.54 weight % and about 0.74 weight %.

9. A clean aluminum alloy in accordance with claim 6 or claim 7, wherein said copper is present at a concentration ranging between about 0.15 weight % and about 0.3 weight %.

10. A clean aluminum alloy in accordance with claim 6 or claim 7, wherein said copper is present at a concentration ranging between about 0.15 weight % and about 0.25 weight %.

11. A clean aluminum alloy in accordance with claim 6 or claim 7, wherein said iron is present at a concentration ranging between about 0.05 weight % and 0.2 weight %.

12. A clean aluminum alloy in accordance with claim 11, wherein said iron is present at a concentration less than about 0.1 weight %.

13. A method of producing a corrosion-resistant article for use in semiconductor processing, wherein said article comprises a body formed from a clean aluminum alloy, and wherein at least one surface of said body, which is to be exposed to a corrosive environment, is covered with an anodized layer, and wherein at least said surface of said body which is covered with said anodized layer is an aluminum alloy having impurity particulates controlled within limits so that at least 85% of all impurity particulates are less than about 5 μm in size, less than 15% of said impurity particulates range from 54 μm to 20 μm in size, less than about 1% of said impurity particulates are be larger than 20 μm in size, and no impurity particulates are larger than 40 μm in size.

14. A method in accordance with claim 13, wherein said impurity particulates comprise impurities selected from the group consisting of magnesium, silicon, iron, copper, manganese, zinc, chromium, titanium, and compounds thereof.

15. A method in accordance with claim 14, wherein iron is present at atomic concentration of less than about 0.2 weight %, and copper is present at an atomic concentration of less than about 0.3 weight %.

16. A method in accordance with claim 15, wherein iron is present at an atomic concentration of less than about 0.1 weight % and copper is present at an atomic concentration of less than about 0.25 weight %.

17. A method in accordance with claim 16, wherein copper is present at an atomic concentration ranging from about 0.15 to about 0.25 weight %.

18. A method in accordance with claim 14, wherein said impurities include the following present at an atomic weight % as specified or lower, silicon at 0.74 weight %; iron at 0.2 weight %; copper at 0.3 weight %; and magnesium at 1.1 weight %.

19. A method in accordance with claim 14, wherein said impurities are present at the following concentrations or lower: silicon at 0.74 weight %; iron at 0.2 weight %; copper at 0.3 weight %; manganese at 0.14 weight %; zinc at 0.15 weight %; chromium at 0.28 weight %; titanium at 0.06 weight %, and magnesium at 1.1 weight %, and wherein a total of other impurities present in said aluminum alloy ranges is 0.15 weight % or less, with individual other impurities limited to a maximum of 0.05 weight % each.

20. A method in accordance with claim 18 or claim 19, wherein said silicon is present at a concentration ranging between about 0.54 weight % and about 0.74 weight %.

21. A method in accordance with claim 18 or claim 19, wherein said copper is present at a concentration ranging between about 0.15 weight % and about 0.3 weight %.

22. A method in accordance with claim 21, wherein said copper is present at a concentration ranging between about 0.15 weight % and about 0.25 weight %.

23. A method in accordance with claim 18 or claim 19, wherein said iron is present at a concentration ranging between about 0.05 weight % and 0.2 weight %.

24. The method in accordance with claim 23, wherein said iron is present at a concentration less than about 0.1 weight %.

* * * * *